United States Patent
Kanbe

(10) Patent No.: US 8,482,040 B2
(45) Date of Patent: Jul. 9, 2013

(54) SOLID-STATE IMAGE CAPTURING DEVICE, METHOD OF MANUFACTURING SOLID-STATE IMAGE CAPTURING DEVICE, METHOD OF DRIVING SOLID-STATE IMAGE CAPTURING DEVICE, AND ELECTRONIC APPARATUS

(75) Inventor: Hideo Kanbe, Kanagawa (JP)

(73) Assignee: Sony Corporation, Tokyo (JP)

( * ) Notice: Subject to any disclaimer, the term of this patent is extended or adjusted under 35 U.S.C. 154(b) by 820 days.

(21) Appl. No.: 12/695,328

(22) Filed: Jan. 28, 2010

(65) Prior Publication Data

US 2010/0194936 A1    Aug. 5, 2010

(30) Foreign Application Priority Data

Feb. 5, 2009  (JP) ................. 2009-025347

(51) Int. Cl.
*H01L 27/148* (2006.01)
(52) U.S. Cl.
USPC .............. 257/223; 257/461; 257/E31.067; 257/E31.11; 438/60; 438/90
(58) Field of Classification Search
USPC ....... 257/223, 461, E31.067, E31.11; 438/90, 438/60
See application file for complete search history.

(56) References Cited

U.S. PATENT DOCUMENTS

| 7,948,535 B2 * | 5/2011 | Ellis-Monaghan et al. .. 348/294 |
| 2004/0051801 A1 | 3/2004 | Iizuka et al. |

FOREIGN PATENT DOCUMENTS

| JP | 1990 050480 | 2/1990 |
| JP | 2001308310 | 11/2001 |
| JP | 2004 111590 | 4/2004 |
| JP | 2004-111590 | 4/2004 |
| JP | 2006 120750 | 5/2006 |
| JP | 2006 120966 | 5/2006 |

OTHER PUBLICATIONS

Sony Corporation; Japanese Application No. 2009-025347; Office action dated Feb. 8, 2011; 3 pages.

* cited by examiner

*Primary Examiner* — Tu-Tu Ho
(74) *Attorney, Agent, or Firm* — Dentons US LLP

(57) ABSTRACT

A solid-state image capturing device includes: a substrate; a substrate voltage source which applies a first potential to the substrate during a light reception period and applies a second potential to the substrate during a non-light reception period; and a plurality of pixels which each includes a light receiver which is formed on a front surface of the substrate and generates signal charges in accordance with received light, a storage capacitor which is formed adjacent to the light receiver and accumulates and stores signal charges generated by the light receiver, dark-current suppressors which are formed in the light receiver and the storage capacitor, an electronic shutter adjusting layer which is formed in an area facing the light receiver in the substrate and distant from the storage capacitor and which adjusts potential distribution, and a floating diffusion portion to which the signal charges accumulated in the storage capacitor are transmitted.

15 Claims, 9 Drawing Sheets

SOLID-STATE IMAGE CAPTURING DEVICE, METHOD OF MANUFACTURING SOLID-STATE IMAGE CAPTURING DEVICE, METHOD OF DRIVING SOLID-STATE IMAGE CAPTURING DEVICE, AND ELECTRONIC APPARATUS

BACKGROUND OF THE INVENTION

1. Field of the Invention

The present invention relates to a solid-state image capturing device, and particularly, to a CMOS type solid-state image capturing device, a manufacturing method of the same, a driving method of the same, and an electronic apparatus using the solid-state image capturing device.

2. Description of the Related Art

A general CMOS solid-state image capturing device according to the related art uses a method of sequentially reading signal charges generated and accumulated in light receivers of pixels arranged in a two-dimensional matrix shape in every column. In this case, since exposure timing in the light receiver in each pixel is determined by initiation and termination of the reading of the signal charges, the exposure timing is different in every pixel. For this reason, when the image of a fast moving subject is captured using such a CMOS type solid-state image capturing device, a problem may arise in that an image obtained by capturing the image of the subject is deformed.

In order to solve this problem, a simultaneous image capturing function (global shutter function) of realizing simultaneous accumulation of signal charges has recently been suggested. Moreover, a CMOS type solid-state image capturing device having the global shutter function has increasingly been used.

In the CMOS type solid-state image capturing device having the global shutter function, the signal charges generated in a light receiver are generally stored until the signal charges are read. Therefore, a charge accumulator having a light shielding property is necessary (for example, Japanese Unexamined Patent Application Publication No. 2004-111590).

The exemplary configuration of the CMOS type solid-state image capturing device having the suggested global shutter function according to the related art will be described below.

(1) There has been suggested a CMOS type solid-state image capturing device in which an FD (Floating Diffusion) portion is used as a charge accumulator without providing a charge accumulator. In this case, the FD portion and a reading gate configured to execute transmission between the FD portion and a light receiver are shielded from light. In the CMOS type solid-state image capturing device with such a configuration, all of the light receivers are first reset. The light receivers are reset by a method of using the reading gate and the FD portion or a method of forming the structure of a reset gate and a drain of the light receiver. Subsequently, the light reception is initiated by turning off the reading gate, and the signal charges are transmitted from the light receivers by simultaneously executing the reading in the reset FD portions of all of the pixels upon terminating the light reception and by turning on the gate. Subsequently, the gate is turned off by transmitting and then reading the signal charges. Subsequently, the signal charges accumulated in the FD portion are sequentially read by a pixel amplifier and are output to the column circuit via a signal line. Since the light receiver can almost continuously receive light of the subsequent frame in the reading method, the reading method is used in many cases particularly when a video is captured.

In the above-described configuration, since a separate charge accumulator is not formed and the FD portion serves as the function of the charge accumulator, a simpler configuration can be realized. Therefore, the path area of the light receiver can be made larger. In the CMOS type solid-state image capturing device with such a configuration, leak current in the FD portion is larger by about $10^3$ to $10^5$ times than that of the HAD (Hole-Accumulation Diode) configuration (HAD: registered trademark) of the same area. For this reason, problems with an S/N ratio may arise in this configuration.

(2) There has been suggested a CMOS type solid-state image capturing device in which a charge accumulator is formed between a light receiver and an FD portion. In this case, a transmission gate is formed to transmit charges between the light receiver and the charge accumulator and a reading gate is formed to transmit charges between the charge accumulator and the FD portion.

In the CMOS type solid-state image capturing device with such a configuration, the light receivers are simultaneously reset in all pixels. Subsequently, photoelectric conversion and accumulation of the signal charges are simultaneously executed in the light receivers of all the pixels in the state where the transmission gates are turned off. Subsequently, by simultaneously turning on the transmission gates in all the pixels, the signal charges are transmitted from the light receivers to the charge accumulators. After the signal charges are transmitted, the transmission gates are turned off and the light reception period is terminated (or the light reception of the subsequent frame and the accumulation of the signal charges are continuously executed). Subsequently, the signal charges accumulated in the charge accumulators are read in the FD portions by sequentially turning on/off the reading gates.

The CMOS type solid-state image capturing device executing the accumulation and transmission has an advantage in which the degree of reading freedom is large and dark current is easily reduced. However, there are disadvantages in that a space is restrictive to guarantee both the accumulated capacity of the light receiver and the accumulated capacity of the storage capacitor in each pixel and it is difficult to guarantee the amount of charge.

(3) There has been suggested a CMOS type solid-state image capturing device having the configuration of (2) and an intermediate configuration of the configurations of (1) and (2) in which the method of transmitting the signal charges is changed. In this transmitting method, the signal charges subjected to the photoelectric conversion are transmitted from the light receiver to the charge accumulator during turning on the transmission gate and the signal charges are accumulated in the charge accumulator. The signal charges accumulated in the charge accumulator are read in the FD portion in line order by turning on/off the reading gate.

In the transmitting method, since the transmission gate is turned on during the light reception, there is a disadvantage in that dark current easily occurs from an insulating film below the transmission gate and a silicon interface.

In order to realize the CMOS type solid-state image capturing device according to the related art, problems may arise in the light shielding property of the charge accumulator, a saturation charge capacity (Qs) of the charge accumulator, an aperture ratio of the light receiver, the Qs of the light receiver (type of accumulation of the signal charges in the light receiver), and the like.

SUMMARY OF THE INVENTION

It is desirable to provide a solid-state image capturing device having a global shutter function and capable of reducing dark current and improving an S/N ratio, a manufacturing method of the same, a driving method of the same, and an electronic apparatus using the solid-state image capturing device.

A solid-state image capturing device according to an embodiment of the invention includes a substrate and a substrate voltage source applying different potentials during a light reception period and a non-light reception period. The substrate is provided with plural pixels each including a light receiver, a storage capacitor, dark-current suppressors, and a floating diffusion portion.

The light receiver is formed on the front surface of the substrate and generates signal charges in accordance with received light. The storage capacitor is formed in an area adjacent to the light receiver. The storage capacitor accumulates and stores the signal charges generated in the light receiver and transmitted when a first potential is applied to the substrate.

The dark-current suppressors are formed in the light receiver and the storage capacitor.

The electronic shutter adjusting layer is formed in an area facing the light receiver in the substrate and distant from the storage capacitor by a desired offset area. The electronic shutter adjusting layer adjusts potential distribution of the substrate so that the signal charges generated in the light receiver upon applying a second potential to the substrate are swept to the rear surface of the substrate.

In the solid-state image capturing device according to the embodiment of the invention, the potential distribution in the substrate varies during the light reception period and the non-light reception period. In particular, the potential distribution of the lower portion of the light receiver varies by an effect of the electronic shutter adjusting layer. In this way, the signal charges generated in the light receiver are transmitted to the storage capacitor during the light reception period and are swept to the rear surface of the substrate during the non-light reception period.

A method of manufacturing the solid-state image capturing device according to an embodiment of the invention includes the steps of preparing a first conduction type semiconductor substrate and forming a second conduction type semiconductor well layer on the semiconductor substrate. The method includes the step of forming a light receiver, a storage capacitor adjacent to the light receiver, and a floating diffusion portion adjacent to the storage capacitor with a transmission gate portion interposed therebetween on a surface of the semiconductor well layer. The method includes the step of forming a first conduction type electronic shutter adjusting layer formed in an area facing the light receiver between the semiconductor substrate and the semiconductor well layer and distant from the storage capacitor by a predetermined offset distance before or after forming the semiconductor well layer. The method includes the step of forming dark-current suppressors above the storage capacitor and the light receiver on a light incident side.

A method of driving a solid-state image capturing device according to an embodiment of the invention includes the step of initiating transmission of the signal charges generated in the light receivers of all the pixels to the storage capacitors by applying the first potential to the substrate by the substrate voltage source in the solid-state image capturing device. The transmission of the signal charges generated in the light receivers of all the pixels to the storage capacitors is terminated by applying the second potential to the substrate by the substrate voltage source, and then sweeping the signal charges generated in the light receiver to the substrate. The signal charges generated in the light receiver are swept to the substrate and the signal charges accumulated in the storage capacitor of every pixel are transmitted to the floating diffusion portion.

In the method of driving the solid-state image capturing device according to the embodiment of the invention, the signal charges generated in the light receiver are transmitted to be accumulated in the storage capacitor while the first potential is applied to the semiconductor substrate. When the second potential is applied, the signal charges generated in the light receiver are not transmitted to the stored capacitor, but are swept to the semiconductor substrate. That is, by varying the potential applied to the semiconductor substrate, it is possible to control the transmission of the signal charges to the storage capacitor.

An electronic apparatus according to an embodiment of the invention includes an optical lens, the solid-state image capturing device, and a signal processing circuit. The solid-state image capturing device is applied to the electronic apparatus according to an embodiment of the invention.

The solid-state image capturing device according to the embodiments of the invention is capable of inhibiting the dark current and improving the S/N ratio. Moreover, the electronic apparatus realizing improved image quality can be obtained.

DESCRIPTION OF THE PREFERRED EMBODIMENTS

Hereinafter, a solid-state image capturing device, a manufacturing method of the same, a driving method of the same, and an example of an electronic apparatus according to embodiments of the invention will be described with reference to FIGS. 1 to 9. The embodiments of the invention will be described in the following order. The invention is not limited to the following embodiments.

1. First Embodiment: Example of Solid-State Image Capturing Device
1.1 Configuration of Overall Solid-State Image Capturing Device
1.2 Cross-Section Configuration of Solid-State Image Capturing Device
1.3 Method of Manufacturing Solid-State Image Capturing Device
1.4 Method of Driving Solid-State Image Capturing Device
2. Second Embodiment: Example of Solid-State Image Capturing Device
3. Third Embodiment: Example (Layout Example) of Solid-State Image Capturing Device
4. Fourth Embodiment: Example of Electronic Apparatus
1. First Embodiment: Example of Solid-State Image Capturing Device
1.1 Configuration of Overall Solid-State Image Capturing Device FIG. 1 is a diagram illustrating an overall configuration of a solid-state image capturing device according to a first embodiment of the invention.

Figure 1:
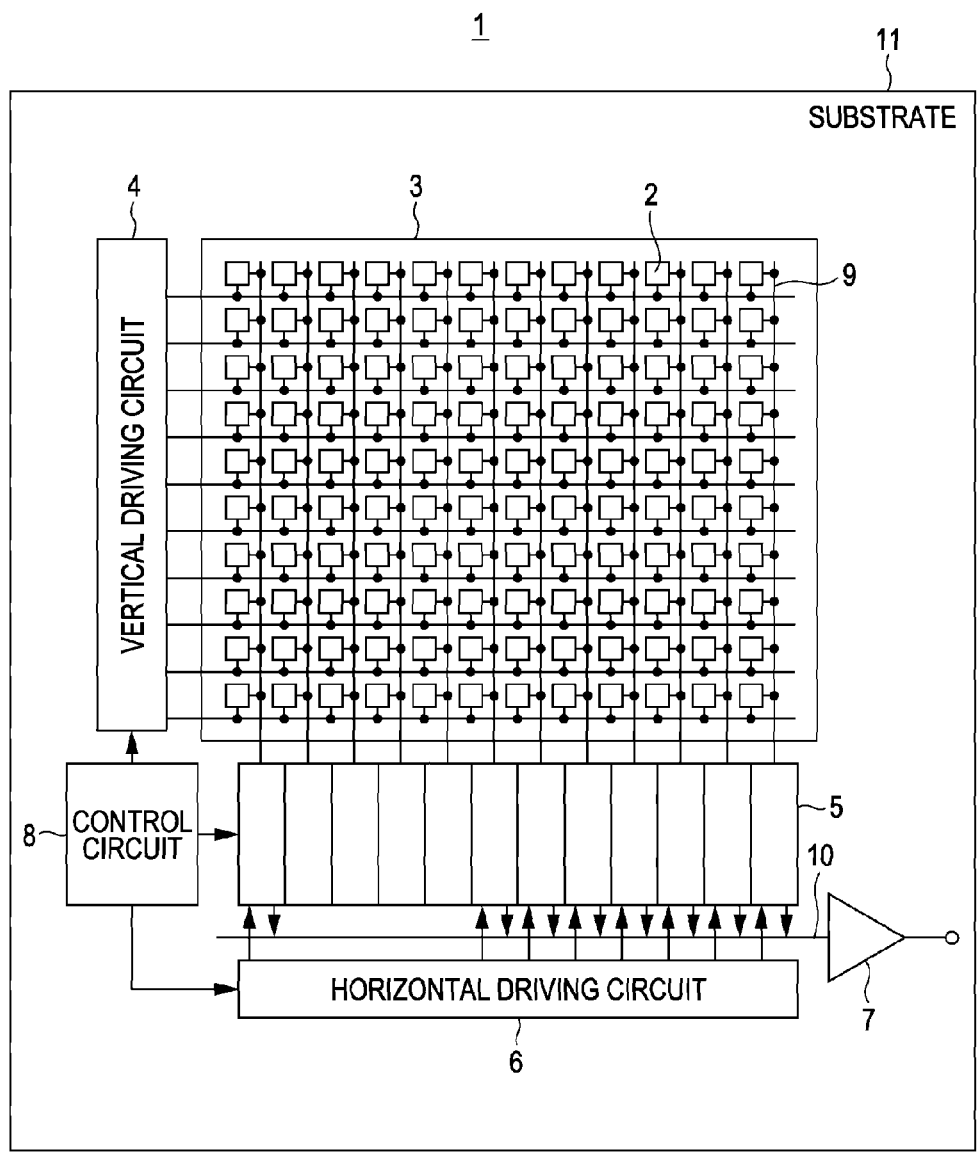
FIG. 1 is a diagram illustrating an overall configuration of a solid-state image capturing device according to a first embodiment of the invention.

A solid-state image capturing device 1 shown in FIG. 1 includes an image capture area 3 including plural pixels 2 arranged on a semiconductor substrate 11 made of silicon, a vertical driving circuit 4, column signal processing circuits 5, a horizontal driving circuit 6, an output circuit 7, and a control circuit 8.

The pixels 2 include a light receiver formed of a photo diode, a storage capacitor storing signal charges generated in the light receiver, and plural MOS transistors. The plural pixels 2 are arranged uniformly in a two-dimensional array shape on the semiconductor substrate 11. The MOS transistors of the pixel 2 may include four MOS transistors, that is, a transmission transistor, a reset transistor, a selection transistor, and an amplification transistor or may include three transistors excluding the selection transistor.

The image capture area 3 includes the plural pixels 2 arranged uniformly in the two-dimensional array shape. The image capture area 3 includes an effective pixel area, which receives light in effect and which amplifies the signal charges generated by photoelectric conversion and reads the signal charges in the column signal processing circuits 5, and a black reference pixel area which is formed in the circumference of the effective pixel area and outputs optical black serving as a reference of a black level.

On the basis of a vertical synchronization signal, a horizontal synchronization signal, and a master clock, the control circuit 8 generates a clock signal, a control signal, or the like which are references of the operations of the vertical driving circuit 4, the column signal processing circuits 5, the horizontal driving circuit 6, and the like. The clock signal, the control signal, or the like generated by the control circuit 8 are input to the vertical driving circuit 4, the column signal processing circuits 5, the horizontal driving circuit 6, and the like.

The vertical driving circuit 4 includes a shift register, for example, and selectively scans the pixels 2 of the image capture area 3 in a row unit sequentially in a vertical direction. A pixel signal based on the signal charges generated in accordance with an amount of light received by the photo diode of each pixel 2 is supplied to the column signal processing circuit 5 through vertical signal lines.

The column signal processing circuit 5 is disposed in every column of the pixels 2, for example. The column signal processing circuit 5 executes a signal processing operation, such as a noise removing operation or a signal amplifying operation on signals output from the one-row pixels 2 in every pixel column on the basis of signals from the black reference pixel area (which is not shown and formed in the circumference of the effective pixel area). Horizontal selection switches (not shown) are disposed between the output terminals of the column signal processing circuits 5 and a horizontal signal line 10.

The horizontal driving circuit 6 includes a shift register, for example. The horizontal driving circuit 6 sequentially outputs horizontal scanning pulses and sequentially selects the column signal processing circuits 5 to output the pixel signals from the column signal processing circuits 5 to the horizontal signal line 10.

Figure 2:
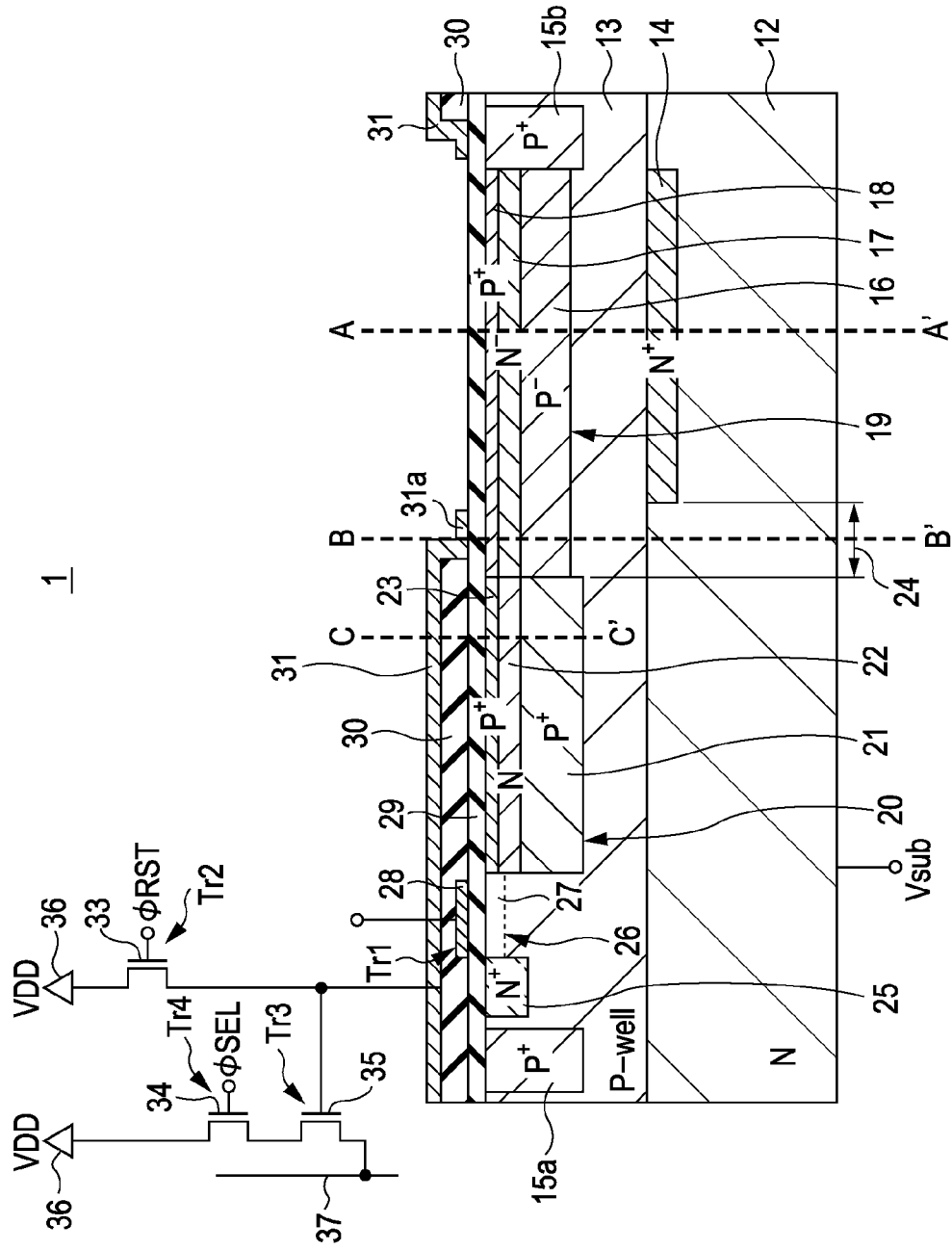
FIG. 2 is a schematic sectional view illustrating the configuration of the solid-state image capturing device according to the first embodiment of the invention.

The output circuit 7 executes a signal processing operation on the signals sequentially supplied from the column signal processing circuits 5 via the horizontal signal line 10.
1.2 Cross-Section Configuration of Solid-State Image Capturing Device FIG. 2 is a schematic sectional view illustrating the configuration of one pixel in the solid-state image capturing device 1 according to the embodiment of the invention. In this embodiment of the invention, a first conductive type is an N type and a second conductive type is a P type.

The solid-state image capturing device 1 according to this embodiment includes a substrate including a semiconductor substrate 12 and a semiconductor well layer 13, a light shielding film 31, and a substrate voltage source (not shown). In the semiconductor well layer 13, there are formed the light receiver 19, the storage capacitor 20, an electronic shutter adjusting layer 14, first and second dark-current suppressors 18 and 23, an FD portion 25, and a pixel including the plural MOS transistors. In FIG. 2, only a transmission transistor Tr1 forming a transmission gate portion 26 is illustrated among the plural MOS transistors. An amplification transistor Tr3, a reset transistor Tr2, and a selection transistor Tr4 are illustrated as circuits in the drawing.

The semiconductor substrate 12 is formed of an N-type CZ substrate made of silicon, for example. A substrate voltage source (not shown) is connected to the semiconductor substrate 12. The substrate voltage source supplies different substrate voltages Vsub to the semiconductor substrate 12 during a light reception period in the light receiver 19 and during a transmission period of a signal charge from the storage capacitor 20 to the FD portion 25. The substrate voltage source may be provided in the device or may be included as a substrate voltage generating circuit in the solid-state image capturing device 1.

The semiconductor well layer 13 is formed of a P-type epitaxial formed on the semiconductor substrate 12. In this embodiment, the surface of the semiconductor well layer 13 opposite to a side adjacent to the semiconductor substrate 12 serves as a light receiving surface.

The light receiver 19 includes an N-type low concentration impurity area ($N^-$ area) 17 and a P-type low concentration impurity area ($P^-$ area) 16. The $N^-$ area 17 is formed on the light receiving surface of the semiconductor well layer 13. The $P^-$ area 16 is formed on the surface opposite to the light receiving surface with respect to the $N^-$ area 17 so as to be adjacent to the $N^-$ area 17. That is, in this embodiment, the light receiver 19 is formed of the photo diode having a junction surface with the first dark-current suppressor 18, the $N^-$ area 17, and the $P^-$ area 16. In the light receiver 19, light incident from the light receiving surface is subjected to photoelectric conversion in a photo diode area and a signal charge corresponding to the amount of light is generated.

The storage capacitor 20 includes a second dark-current suppressor 23, an N-type impurity area (N area) 22, and a P-type high concentration impurity area ($P^+$ area) 21. The storage capacitor 20 is formed adjacent to the light receiver 19 formed in the semiconductor well layer 13. The N area 22 is formed on the side of the light receiving surface of the semiconductor well layer 13 and is formed in an area adjacent in a horizontal direction with respect to the N⁻ area 17 of the light receiver 19. The P⁺ area 21 is formed in the area opposite to the light receiving surface with respect to the N area 22 so as to be adjacent to the N area 22. That is, in the storage capacitor 20, a potential well is formed by the junction surface of the second dark-current suppressor 23 and the N area 22 and the junction surface of the N area 22 and the P⁺ area 21. Therefore, the signal charges generated in the light receivers 19 are accumulated in the N area 22. Here, the electrostatic potential of the storage capacitor 20 is deeper than the electrostatic potential of the light receiver 19.

The first dark-current suppressor 18 is formed on the uppermost surface on the side of the light receiving surface of the light receiver 19 formed in the semiconductor well layer 13. The second dark-current suppressor 23 is formed on the uppermost surface on the light receiving surface of the storage capacitor 20. The first and second dark-current suppressors 18 and 23 are formed from the P-type high concentration impurity area and are formed into an integrated portion from the light receiver 19 across the storage capacitor 20. In the first and second dark-current suppressors 18 and 23, dark currents generated in the interface of the light receiving surface are recombined and suppressed by holes serving as plural carriers of the P-type high concentration impurity area. That is, in the light receiver 19 and the storage capacitor 20 according to the embodiment, a so-called embedded photodiode of an HAD (Hole-Accumulation Diode) configuration (HAD: registered trademark) is formed.

The electronic shutter adjusting layer 14 is formed in the area of the semiconductor substrate 12 opposite to the light receiver 19 so as to be adjacent to the semiconductor well layer 13 and is formed by the N-type high concentration impurity area. The electronic shutter adjusting layer 14 is formed on the side of the light receiver 19 so as to be separated horizontally from the area where the storage capacitor 20 by a predetermined offset area 24. As described below, the offset area 24 is an area where the potential distribution of the semiconductor substrate 12 and the semiconductor well layer 13 is optimized.

The FD portion 25 is formed on the side of the light receiving surface of the semiconductor well layer 13 and is formed by an N-type high concentration impurity area. The transmission gate portion 26 is formed between the FD portion 25 and the storage capacitor 20.

The transmission gate portion 26 is formed by the transmission transistor Tr1 of the MOS transistors. The transmission transistor Tr1 is formed such that a source serves as the storage capacitor 20 and a drain serves as the FD portion 25. A transmission gate electrode 28 of the transmission transistor Tr1 is formed above the semiconductor well layer 13, in which the transmission gate portion 26 is formed, with a gate insulating film 29 interposed therebetween. A channel area 27 is formed in the transmission gate portion 26 by applying a transmission pulse φTRG to the transmission gate electrode 28 and the signal charges accumulated in the storage capacitor 20 is transmitted to the FD portion 25.

On the side of the FD portion 25 of the semiconductor well layer 13, a channel stop area 15a separating the adjacent pixels is formed by a P-type high concentration impurity area. On the side of the light receiver 19 of the semiconductor well layer 13, a channel stop area 15b separating the adjacent pixels is formed by a P-type high concentration impurity area. A unit pixel is formed by the area surrounded by the channel stop areas 15a and 15b. Even though the reset transistor Tr2, the amplification transistor Tr3, and the selection transistor Tr4 are illustrated as the circuits in FIG. 2, the reset transistor Tr2, the amplification transistor Tr3, and the selection transistor Tr4 (as necessary) in addition to the transmission transistor Tr1 are formed in the semiconductor well layer 13 of the unit pixel.

The reset transistor Tr2 is formed such that a source is connected to the FD portion 25 and a drain is connected to a power-supply voltage 36. A reset wire (not shown) to which a reset pulse φRSG is applied is connected to a reset gate electrode 33.

The amplification transistor Tr3 is formed such that a source is connected to the power-supply voltage 36 and a drain is connected to the source of the selection transistor Tr4. The FD portion 25 is connected to an amplification gate electrode 35.

The selection transistor Tr4 is formed such that a source is connected to the drain of the amplification transistor Tr3 and a source is connected to a column signal line 37. A selection wire (not shown) to which a selection pulse φSEL is applied is connected to a selection gate electrode 34.

In FIG. 2, the configuration in which the selection transistor Tr4 is formed is shown, but a configuration in which no selection transistor Tr4 is formed may be embodied.

The light shielding film 31 is formed so as to cover the surface other than the light receiver 19 above electrode wires such as the transmission gate electrode 28 and the like formed on the semiconductor well layer 13, with an inter-layer insulating layer 30 interposed therebetween. At this time, the end of the light shielding film 31 formed above the storage capacitor 20 is formed so as to have a protrusion portion 31a protruding only to a predetermined area of the light receiver 19.

Next, the potential profile of the solid-state image capturing device 1 according to this embodiment will be described with reference to FIG. 3. In the following description, the semiconductor 12 and the semiconductor well layer 13 are termed a "substrate" together, when it is not necessary to distinguish the semiconductor 12 from the semiconductor well layer 13.

Figure 3:
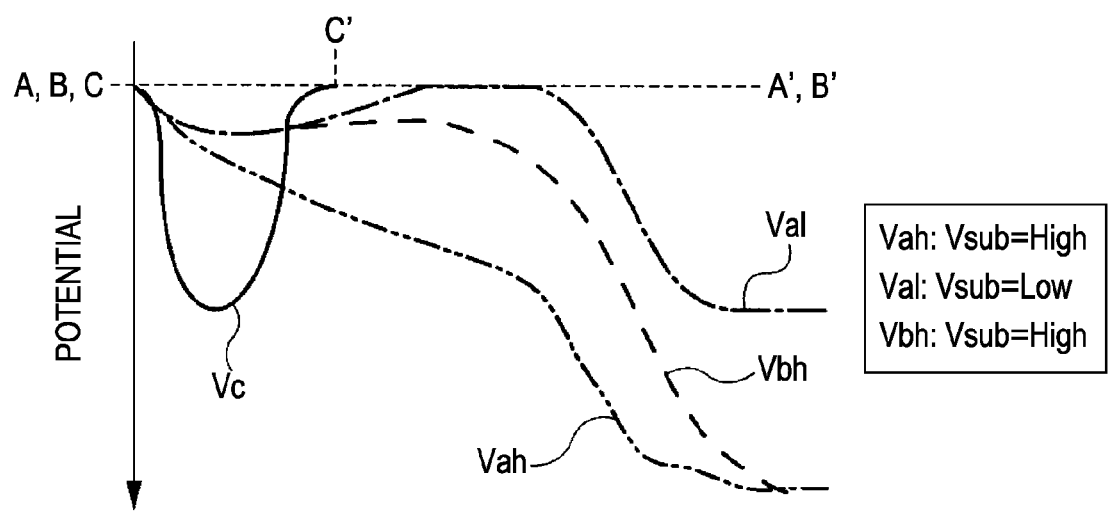
FIG. 3 is a diagram illustrating potentials of a substrate of the solid-state image capturing device according to the first embodiment of the invention.

FIG. 3 is a diagram illustrating a potential distribution of the potential of the substrate along the lines A-A', B-B', and C-C' of FIG. 2. The line A-A' shows a potential distribution in a vertical direction of the substrate including the light receiver 19 and the electronic shutter adjusting layer 14. The line B-B' shows a potential distribution in the vertical direction of the substrate including the light receiver 19 and the offset area 24. The line C-C' shows a potential distribution in the vertical direction of the substrate including the storage capacitor 20.

A one-dot chain line shown in FIG. 3 indicates a potential Val along the line A-A', when the substrate voltage Vsub is set to a first potential (hereinafter, referred to as Low). A two-dot chain line shown in FIG. 3 indicates a potential Vah along the line A-A', when the substrate voltage Vsub is set to a second potential (hereinafter, referred to as High) which is higher than the first potential. A broken line shown in FIG. 3 indicates a potential Vbh along the line B-B', when the substrate voltage Vsub is set to High. The solid line shown in FIG. 3 indicates a potential Vc along the line C-C'.

When the substrate voltage Vsub is set to Low, as in FIG. 3, the potential Val along the line A-A' is configured so that the potential in the N⁻ area 17 of the light receiver 19 is deeper than that of the P⁻ area 16 or the semiconductor well layer 13. That is, in the N⁻ area 17 of the light receiver 19, a shallow potential well is formed. The impurity concentration of the N⁻ area 17 is set so as to have a potential shallower by about 1 V than that of the light receiver with a general HAD configuration according to the related art.

When the substrate voltage Vsub is set to Low, the potential (not shown) along the line B-B' is also considered to be the same as the potential Val along the line A-A'. FIG. 3 shows that the semiconductor well area is partially neutralized (not depleted) by the semiconductor well layer 13 of the lower portion of the P⁻ area 16 of the light receiver 19, but may be depleted.

Next, when the substrate voltage Vsub is set to High, the potential Vah along the line A-A' is overall drawn down to the deep portion by an effect of the electronic shutter adjusting layer 14 formed from the N-type high concentration impurity area. The potential Vah varies so as to be deeper toward the semiconductor substrate 12. Since the electronic shutter adjusting layer 14 is not formed along the line B-B' due to the offset area 24, the potential is just slightly deep toward the semiconductor substrate 12. Therefore, the potential Vbh near the light receiver 19 is maintained with almost the same value as that when the substrate voltage Vsub is set to Low.

The potential Vc along the line C-C' is configured such that a potential well deeper than the light receiver 19 is formed by an effect of the junction surface of the N area 22 and the P³⁰ area 21 of the storage capacitor 20.

1.3 Method of Manufacturing Solid-State Image Capturing Device

A method of manufacturing the solid-state image capturing device 1 with the above-described configuration will be described with reference to FIGS. 4 and 5. In FIGS. 4 and 5, the same reference numerals are given to the same portions as those in FIG. 2 and the repeated description is omitted.

Figure 4A:
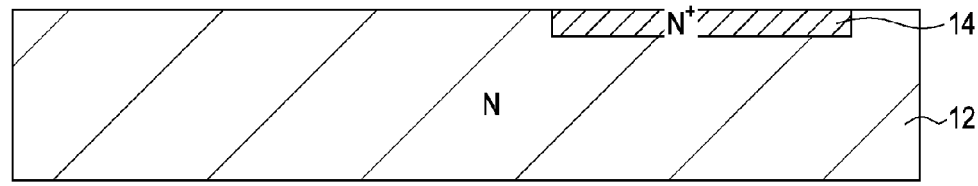
FIGS. 4A to 4C are diagrams (first manufacturing diagrams) illustrating processes of manufacturing the solid-state image capturing device according to the first embodiment of the invention.

First, as shown in FIG. 4A, the N-type semiconductor substrate 12 such as a CZ substrate is prepared. The electronic shutter adjusting layer 14 is formed by ion-implanting N-type impurities with high concentration into a predetermined position above the semiconductor substrate 12.

Figure 4B:
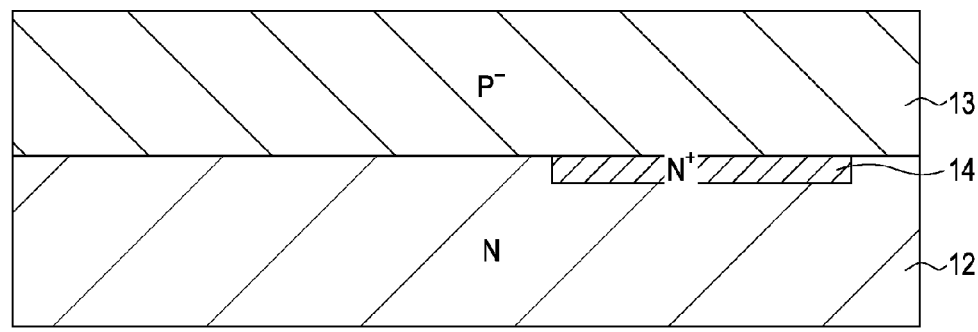

Subsequently, as shown in FIG. 4B, the semiconductor well layer 13 is formed from a P-type epitaxial growth layer by an epitaxial growth method.

Figure 4C:
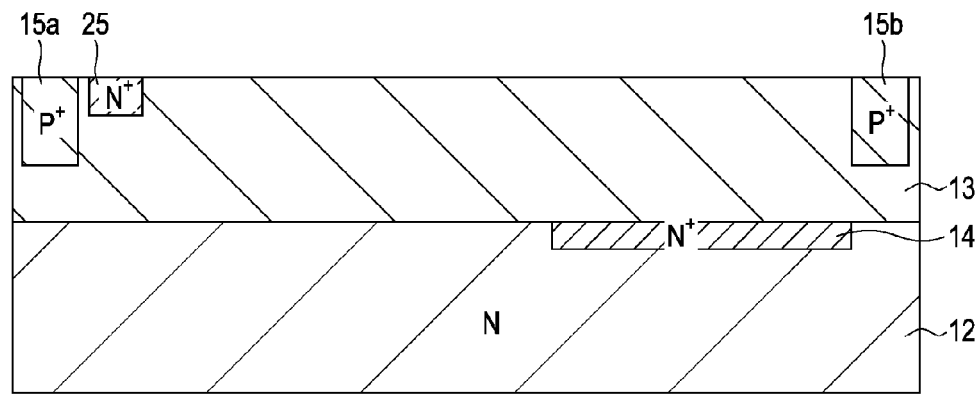

Subsequently, as shown in FIG. 4C, the FD portion 25 is formed by ion-implanting N-type impurities with high concentration into the surface of the semiconductor well layer 13. The channel stop areas 15a and 15b are formed by ion-implanting P-type impurities with high concentration. Moreover, the FD portion 25 or the source and drain areas of each transistor (not shown) may be formed after the gate electrode (the gate electrode 28 and the like) of each transistor, as described below.

Figure 5D:
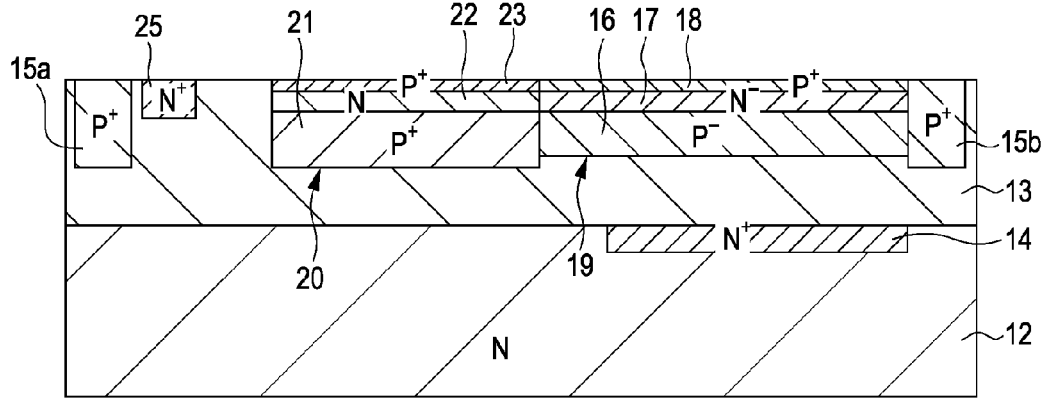
FIGS. 5D to 5F are diagrams (second manufacturing diagrams) illustrating processes of manufacturing the solid-state image capturing device according to the first embodiment of the invention.

Subsequently, as shown in FIG. 5D, the light receiver 19 including the P⁻ area 16 and the N⁻ area 17 is formed by ion-implanting P-type impurities and N-type impurities with low concentration into predetermined positions of the surface of the semiconductor well layer 13, respectively. The storage capacitor 20 including the P⁺ area 21 and the N area 22 is formed by ion-implanting P-type impurities with high concentration at a predetermined position of the surface of the semiconductor well layer 13 and by ion-implanting N-type impurities into a predetermined position of the surface of the semiconductor well layer 13. Subsequently, the first and the second dark-current suppressors 18 and 23 are formed above the light receiver 19 and the storage capacitor 20 by ion-implanting P-type impurities with high concentration.

Figure 5E:
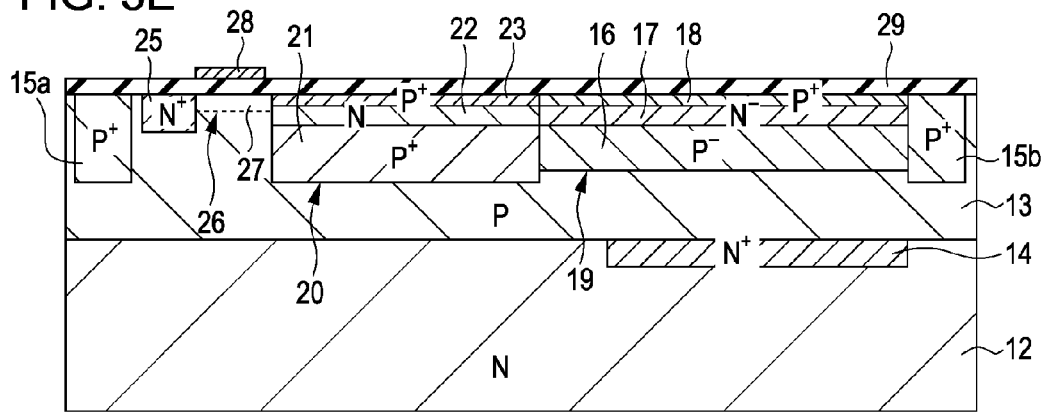

Subsequently, as shown in FIG. 5E, the gate insulating film 29 is formed above the semiconductor well layer 13 and the transmission gate electrode 28 is formed on the gate insulating film 29. The transmission gate electrode 28 is formed by patterning above the transmission gate portion 26 formed in the area between the FD portion 25 and the storage capacitor 20. Even though not shown, in this process, the gate electrodes and the like of the other MOS transistors are formed. Unlike the sequence of the manufacturing process according to this embodiment, the source and drain areas, the FD area 25, and the first and second dark-current suppressors 18 and 23 may be formed after the gate insulating film 29, the gate electrode 28, and the like are formed. Since it is desirable that the source and drain areas, the FD area 25, and the first and second dark-current suppressors 18 and 23 have a shallow concentration profile, the source and drain areas, the FD area 25, and the first and second dark-current suppressors 18 and 23 are formed in many cases after the gate insulating film 29 or the gate electrode 28 is formed in a high-temperature process.

Figure 5F:
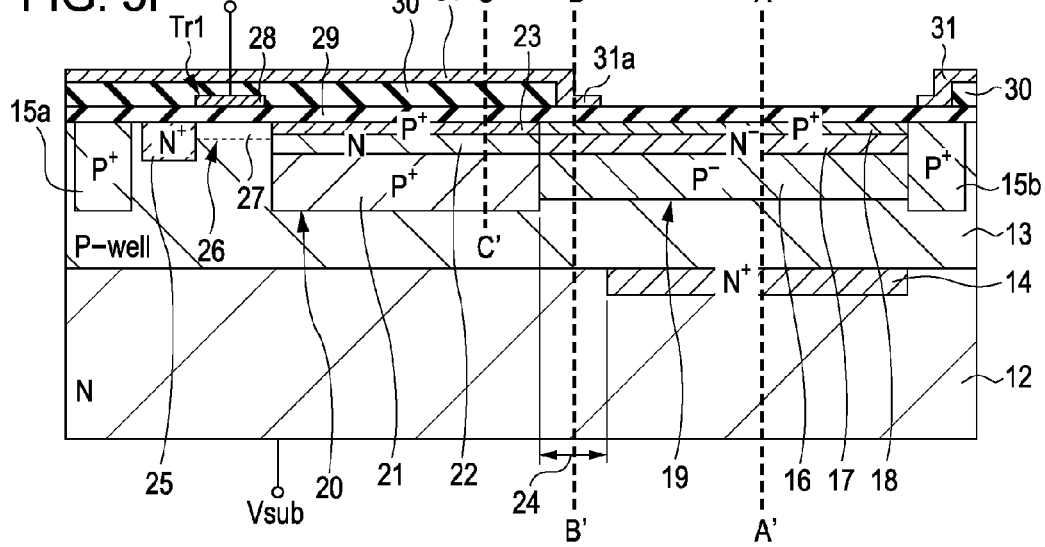

Subsequently, as shown in FIG. 5F, a desired electrode is formed, and then the light shielding film 31 is formed in the area excluding the light receiver 19 with the inter-layer insulating film 30 interposed therebetween. The end of the light shielding film 31 formed above the storage capacitor 20 on the side of the light receiver 19 is formed so as to have the protrusion portion 31a protruding toward the light receiver 19. The light shielding film 31 may also serve as a desired wire layer.

Subsequently, the same layers, such as a desired wire layer, a flattened film, a color filter, an on-chip lens, or the like, of a solid-state image capturing device according to the related art are formed on the light shielding film. Moreover, the solid-state image capturing device 1 according to this embodiment is completed by connecting a variable substrate voltage source to the semiconductor substrate 12. The substrate voltage source may be embedded as a substrate voltage generating circuit in a chip of the solid-state image capturing device 1.

In this embodiment, the semiconductor well layer 13 is formed in the P-type epitaxial growth layer, but may be formed in an N-type epitaxial growth layer. In this case, a P well (corresponding to the semiconductor well layer 13) is formed by ion-implanting P-type impurities so that a pixel area in the matrix shape is contained in the N-type epitaxial growth layer. Moreover, it is necessary to differentiate the profile of the P⁻ area 16 of the light receiver 19 to realize the function.

The electronic shutter adjusting layer 14 may be formed by ion-implanting N-type impurities with high energy and with high concentration, after the semiconductor well layer 13 is formed. In this embodiment, the electronic shutter adjusting layer 14 is buried in the semiconductor substrate 12, but may be formed in the semiconductor well layer 13 so as to be adjacent to the semiconductor substrate 12.

In this embodiment, the gate insulating film 29 is formed on the entire surface of the semiconductor well layer 13. However, the gate insulating film 29 on the gate portion 26 or a different insulting film formed on the light receiver 19 or the storage capacitor 20 may be separately formed.

The light receiver 19 or the storage capacitor 20 may be formed after the process shown in FIG. 5E. Moreover, the first and second dark-current suppressors 18 and 23 may be formed after the process shown in FIG. 5E.

Even though not shown, this embodiment includes processes of forming the amplification transistor, the selection transistor, the reset transistor, the wires thereof, a driving circuit section outside the pixel area, the control circuit section, a reading circuit section, and the like, in addition to the above-described processes.

1.4 Method of Driving Solid-State Image Capturing Device

Next, a method of driving the solid-state image capturing device 1 according to this embodiment will be described. Before the method of driving the solid-state image capturing device 1 according to this embodiment is described, the principle of generating and accumulating the signal charges in the light receiver 19 and the storage capacitor 20 will be first described with reference to the potential graph shown in FIG. 3.

When the substrate voltage Vsub is set to Low, as in FIG. 3, in the case of the potential Val along the line A-A', the potential in the N⁻ area 17 is deeper than that of the P⁻ area 16 or the semiconductor well layer 13. When the substrate voltage Vsub is set to Low, even though not shown, the potential along the line B-B' is also the same as the potential Val along the line A-A. As for the potential Vc along the line C-C', a potential well deeper than that of the light receiver 19 is formed by the effect of the junction surface of the N area 22 and the P⁺ area 21 forming the second dark-current suppressor 23 and the storage capacitor 20.

Accordingly, the signal charges generated by the light receiver 19 when the substrate voltage Vsub is set to Low flow out without accumulation in the light receiver 19 and are transmitted to the storage capacitor 20 to be accumulated in the storage capacitor 20.

Next, when the substrate voltage Vsub is set to High, the potential Vah along the line A-A' is overall drawn to the deep portion. This is because the electronic shutter adjusting layer 14 is formed by the N-type high concentration impurity area. Since the electronic shutter adjusting layer 14 is not formed along the line B-B', the potential just becomes slightly deep in the semiconductor substrate 12. Therefore, the potential Vbh near the light receiver is not different from that upon setting the substrate voltage Vsub to Low.

Accordingly, when the substrate voltage Vsub is set to High, the signal charges generated by the light receiver 19 are not transmitted to the storage capacitor 20. This is because the potential Vah along the line A-A' becomes deeper than the potential Vbh along the line B-B'. The potential Vah along the line A-A' becomes deep toward the semiconductor substrate 12, since the barrier of the P-type semiconductor well layer 13 may be pressed down by the effect of the electronic shutter adjusting layer 14. Accordingly, the signal charges generated by the light receiver 19 are swept to the semiconductor substrate 12. That is, when the substrate voltage Vsub is set to High, the signal charges subjected to photoelectric conversion by the light receiver 19 do not flow to the storage capacitor 20, but are swept to the semiconductor substrate 12.

In the potential Vbh along the line B-B, the potential near the light receiver 19 is maintained with a value close to the value upon setting the substrate voltage Vsub to Low by the effect of the offset area 24. Accordingly, the signal charges accumulated and stored in the storage capacitor 20 do not flow backward toward the light receiver 19. As for the signal charge accumulated in the storage capacitor 20, even when the substrate voltage Vsub is set to High, the amount of signal charge accumulated until the shallow position of the potential Vc in the light receiver 19 can be stored and maintained.

Figure 6A:
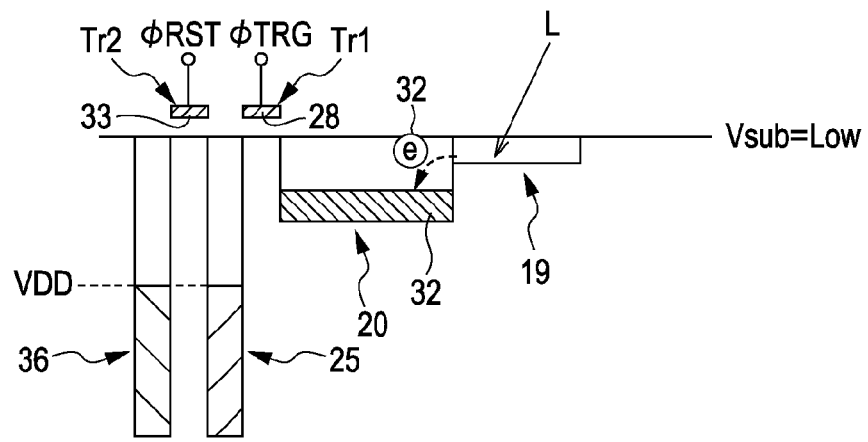
FIGS. 6A to 6C are diagrams illustrating transmission of signal charges in driving the solid-state image capturing device according to the first embodiment of the invention.
Figure 6B:
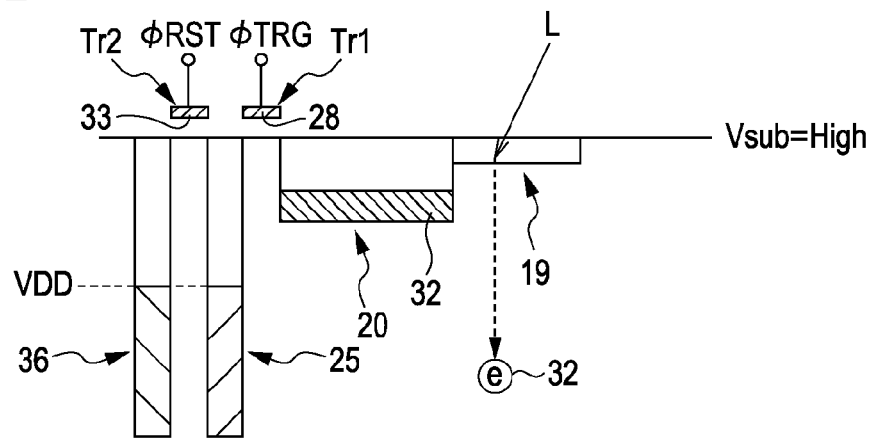
Figure 6C:
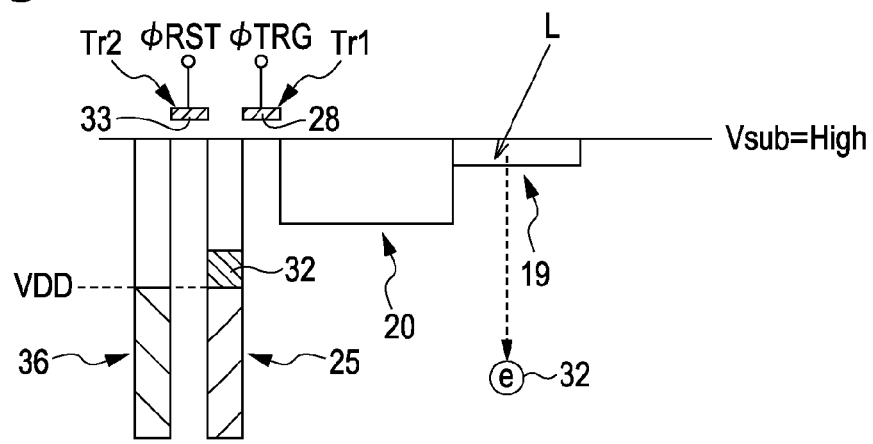

The method of driving the solid-state image capturing device 1 according to this embodiment will be described on the basis of the principle of generating and accumulating the signal charges with reference to FIGS. 6A to 6C. FIGS. 6A to 6C are diagrams schematically illustrating potential wells of the reset transistor Tr2, the transmission transistor Tr1, the light receiver 19, and the storage capacitor 20 of one pixel in the solid-state image capturing device 1 and illustrating the transmission of a signal charge 32. In FIGS. 6A to 6C, the same reference numerals are given to the same portions as those in FIG. 2 and the repeated description is omitted.

First, the substrate voltage Vsub is set to Low by the substrate voltage source. In this way, the generation and accumulation of the signal charges are simultaneously initiated in all of the pixels. Hereinafter, a period of this operation is referred to as a "light reception period".

During the light reception period, as described above, the signal charge generated by the photoelectric conversion of light L incident on the light receiver 19 flows to the storage capacitor 20 to be accumulated and stored, when the substrate voltage Vsub is set to Low, as in FIG. 6A. In this way, in all of the pixels of the solid-state image capturing device 1, the signal charges generated by the photoelectric conversion of simultaneous light are accumulated and stored in the storage capacitors 20.

When the light L having an excessively surplus amount is incident on the light receiver 19 during the light reception period, the signal charges overflowing from the storage capacitor are generated. In this case, the signal charges are absorbed and reset by the FD portion 25 or the power-supply voltage 36 connected to the drain of the reset transistor Tr2. Some of the signal charges generated by the excessively surplus amount of light may overflow toward the semiconductor substrate 12.

Next, the substrate voltage Vsub is set to High by the substrate voltage source. Then, the profiles of the potentials of the substrate are varied in all of the pixels of the solid-state image capturing device 1, as shown in FIG. 3. The signal charges 32 incident on the light receiver 19 and subjected to the photoelectric conversion are swept to the semiconductor substrate 12 and thus are not transmitted to the storage capacitor 20, as shown in FIG. 6B. That is, when the substrate voltage Vsub is set to High, the light reception period is terminated simultaneously in all of the pixels. After the light reception period is terminated, a "reading period (non-light reception period)", during which the signal charges accumulated in the storage capacitor 20 are read in the FD portion, is initiated.

Subsequently, as shown in FIG. 6C, the signal charges 32 accumulated and stored in the storage capacitor 20 are read and transmitted sequentially in line order in the FD portion 25 by turning on the transmission gate electrode 28 of every pixel. Since the substrate voltage Vsub is set to High even upon reading the signal charges in the FD portion 25, the signal charges 32 generated by the photoelectric conversion of the light L continuously incident on the light receiver 19 are swept to the semiconductor substrate 12.

The signal charges 32 read in the FD portion 25 are subsequently amplified by the amplification transistor Tr3 shown in FIG. 2 and are selectively output to the column signal line 37 by the selection transistor Tr4. The pixel signals output to the column signal line 37 are input the horizontal signal line 10 through the column signal processing circuits 5 shown in FIG. 1 and are output through the output circuit 7. The signal charges 32 transmitted to the FD portion are subsequently reset to the power voltage by applying the reset pulse φRST to the reset transistor Tr2.

In this way, in the solid-state image capturing device 1 according to this embodiment, the light reception period is initiated simultaneously in all of the pixels by setting the substrate voltage Vsub to Low, and the signal charges 32 subjected to the photoelectric conversion in the light receivers 19 flow to be transmitted to the storage capacitors 20. Then, immediately after the substrate voltage Vsub is set to High, the light reception period is terminated and the reading period (non-light reception period) is initiated. During the reading period, the signal charges 32 subjected to the photoelectric conversion in the light receiver 19 are swept to the semiconductor substrate 12.

In the solid-state image capturing device 1 according to this embodiment, since the signal charges 32 are not accumulated in the FD portion 25, a CDS operation in the FD portion 25 can be executed. That is, the CDS operation can be executed by resetting the FD portion 25, sampling a non-signal (base noise), turning on/off the transmission gate electrode 28, transmitting the signal charges 32 to the FD portion 25, and reading the signal level.

In the solid-state image capturing device 1 according to this embodiment, the transmission of the signal charges 32 to the storage capacitor 20 and the sweeping of the signal charges 32 to the semiconductor substrate 12 can be controlled by varying the substrate voltage Vsub. That is, an electronic shutter function can be obtained just by varying the substrate voltage Vsub by the effect of the electronic shutter adjusting layer 14 and the offset area 24. In this way, it is possible to realize the solid-state image capturing device 1 having a global shutter function.

In a solid-state image capturing device according to the related art, the light receiver generates and accumulates the signal charges. In the solid-state image capturing device 1 according to this embodiment, since the signal charges 32 are not accumulated in the light receiver 19, the electrostatic potential of the light receiver 19 can be formed so as to be shallower by several volts, compared to the electrostatic potential of the light receiver which generates and accumulates the signal charges according to the related art. In this way, the electric field of the light receiver 19 can be reduced. Moreover, an increase in the dark current caused due to the electric field can be inhibited.

In the solid-state image capturing device having a global shutter function according to the related art, since the transmission gate electrode reads the signal charges from the light receiver, a problem arises in that a reading gate section from a light receiver is deviated in principle from a hole-pinning at reading time. In a configuration in which the transmission gate electrode and an electrode formed on the storage capacitor are incorporated, the storage capacitor is also deviated from the hole-pinning in principle.

In the solid-state image capturing device 1 according to this embodiment, since the dark-current suppressors 18 and 23 with the HAD configuration are formed in the light receiver 19 and the storage capacitor 20, the surface is typically filled with holes. Accordingly, the dark current occurring in the silicon forming the substrate or the oxide film interface forming the gate insulating film 29 can be inhibited, compared to the solid-state image capturing device having the global shutter function according to the related art.

Since the FD portion 25 has a contact portion of the high concentration $N^+$ area and a wire, the FD portion 25 is an area where high leak current (dark current) generally occurs. In the solid-state image capturing device 1 according to this embodiment, however, the signal charges are not accumulated in the FD portion 25. Therefore, the leak current is reduced and thus an S/N ratio is improved. Since the signal charges flow from the light receiver 19 to the storage capacitor 20, no transmission gate section is formed between the light receiver 19 and the storage capacitor 20. Accordingly, surface-depletion does not occur when the signal charges are transmitted from the light receiver 19 to the storage capacitor 20 and the dark current can be reduced. In the solid-state image capturing device 1 according to this embodiment, the area of the light receiver 19 or the storage capacitor 20 can be expanded, compared to the solid-state image capturing device 1 having the transmission gate section configured to transmit the signal charges from the light receiver to the storage capacitor and having the global shutter function. Since the storage capacitor 20 of which the area is expanded can be configured such that the potential of the storage capacitor is relatively shallow, the dark current caused due to the electric field of the storage capacitor can be inhibited. Moreover, owing to the reading in the FD portion, the voltage can be configured to be low.

In a method of executing the photoelectric conversion in the light receiver and accumulating the signal charges in the light receiver during the light reception period like the solid-state image capturing device according to the related art, the electrostatic potential (when the signal charges are depleted) of the light receiver given in an expression of $Q=CV$ is necessary in accordance with the amount of charge handled in the light receiver. Moreover, in order to transmit the signal charges to the storage capacitor, the channel potential (when the signal charges are depleted) of the storage capacitor is sufficiently lower than that of the light receiver or it is necessary to configure the step potential of transfer and storage. In the former case, the transmission pulse φTRG or the amplitude of an operating point of the FD portion may be increased. In the latter case, since it is necessary to configure the storage capacity of the transmission gate so as to be the same as that of the light receiver, the amount of charge handled in a pixel unit may be decreased.

In the solid-state image capturing device 1 according to this embodiment, the potential of the substrate in the light receiver 19 is shallowly formed to be transmitted from the light receiver 19 to the storage capacitor 20. Therefore, the storage capacitor 20 has the substrate potential of a depth to the degree that the charges are swept and transmitted. Moreover, by configuring the lower portion of the N area 22 of the storage capacitor 20 as a layer of which an acceptor (hole) concentration is high, the electrostatic capacity near the unit area is made high. The reason for realizing this configuration is that it is not necessary to expand a depletion layer to the storage capacitor 20 by separately forming the light receiver 19 and the storage capacitor 20. In the solid-state image capturing device, the depletion layer of the light receiver is generally expanded since it is necessary to broadly receive the charges subjected to the photoelectric conversion by incident light. In the light receiver for the visible light, a depletion layer of about 3 micron is configured due to the absorption characteristic of the visible light for silicon. In the solid-state image capturing device according to this embodiment, since the storage capacitor 20 can be specialized so as to accumulate the signal charges, it is not necessary to expand the depletion layer. Since the electrostatic capacity near the unit area is made high, it is possible to shallowly form the electrostatic potential (when the signal charges are depleted) of the storage capacitor 20. With such a configuration, since the shallowest position where the signal charges are accumulated can be set to a position shallowly from the substrate surface of the storage capacitor 20, the transmission amplitude of the transmission pulse φTRG upon reading the signal charges from the storage capacitor 20 to the FD portion 25 can be made low voltage.

According to this embodiment, since the light shielding film 31 shields light in the storage capacitor 20, the incident light passes through the storage capacitor 20 and thus the photoelectric conversion is prevented even during the light reception period and even before and after the light reception. In this embodiment, the FD portion 25 and the transmission gate portion 26 shield light by forming the light shielding film 31 on the FD portion 25 or the transmission gate portion 26.

However, the light shielding film 31 may not be formed. In the solid-state image capturing device having the global shutter function of accumulating the signal charges in the FD portion, it is necessary to form the light shielding film on the FD portion. However, according to this embodiment, since the signal charges are not accumulated in the FD portion 25, it is not necessary to form the light shielding film 31 on the FD portion 25 and the transmission gate portion 26. However, as described below, it is desirable that the transmission gate portion shields light to prevent smearing.

According to this embodiment, the light shielding film 31 is formed so as to have the protrusion portion 31a from the storage capacitor 20 to the light receiver 19. Accordingly, even when the substrate voltage Vsub is set to High and the light reception period is terminated, it is possible to inhibit the light, which is a kind of smear, incident on the vicinity of the storage capacitor 20 in the incident light from entering the storage capacitor 20. Accordingly, in order to inhibit the incident light, which is the smear, from entering the storage capacitor 20, it is desirable to guarantee the light shielding property by forming the light shielding film 31 on the transmission gate portion 26 in terms of smear prevention.

According to this embodiment, the dark current is inhibited and the S/N ratio is improved in the CMOS type solid-state image capturing device having the global shutter function of executing the photoelectric conversion simultaneously in a screen.

2. Second Embodiment: Example of Solid-State Image Capturing Device

Figure 7:
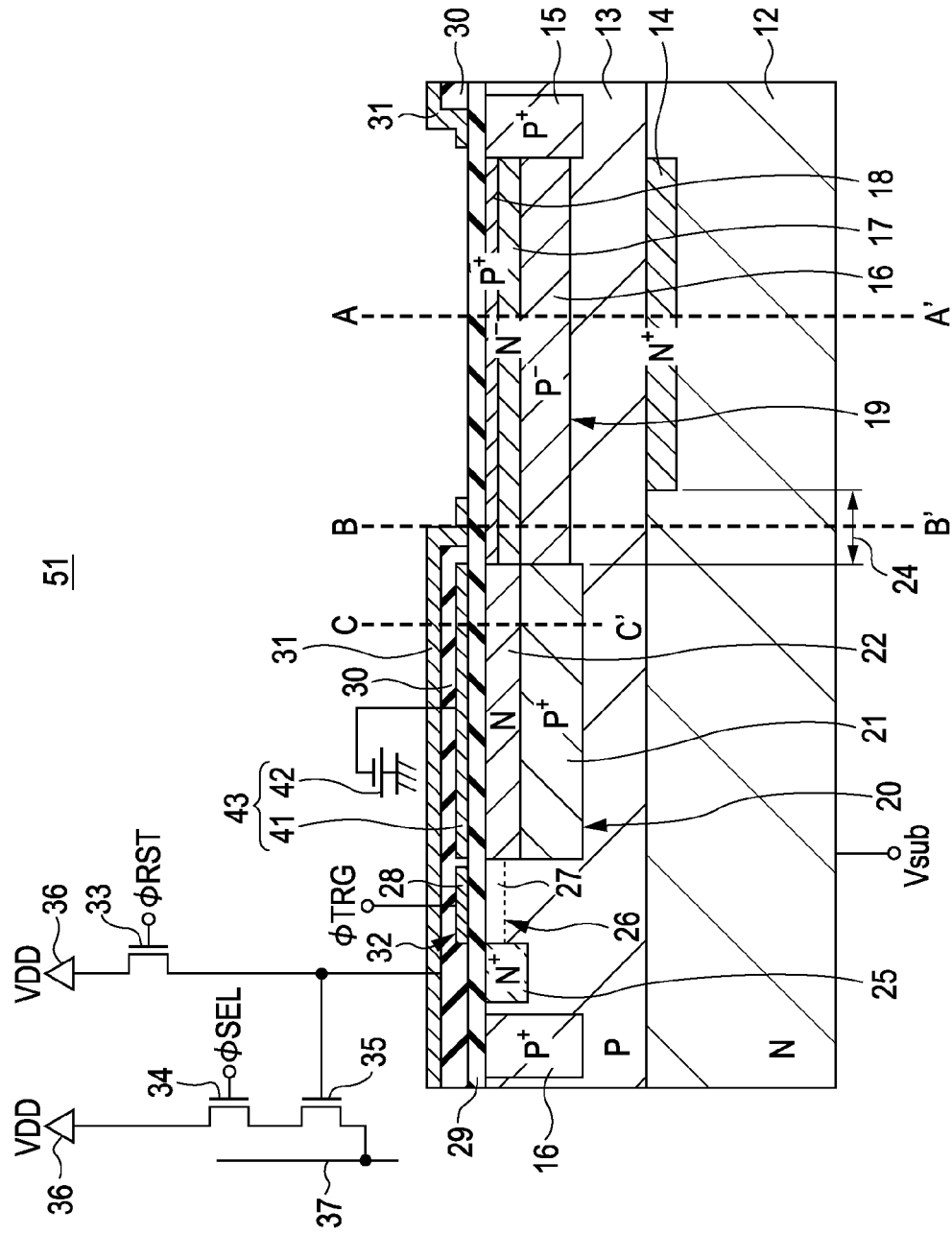
FIG. 7 is a schematic sectional view illustrating the configuration of a solid-state image capturing device according to a second embodiment of the invention.

FIG. 7 is a schematic sectional view illustrating the configuration of a solid-state image capturing device according to a second embodiment of the invention. The same configuration of the solid-state image capturing device according to this embodiment as that in FIG. 1 is omitted. In FIG. 7, the same reference numerals are given to the same portions in FIG. 2 and the repeated description is omitted.

In a solid-state image capturing device 51 according to this embodiment, the configuration of the second dark-current suppressor according to the first embodiment is partially modified.

In this embodiment, a second dark-current suppressor 43 in the storage capacitor 20 includes a dark-current suppressing electrode 41 and a direct current voltage source 42. The dark-current suppressing electrode 41 is formed above the storage capacitor 20 of the semiconductor well layer 13 with a gate insulating film 29 interposed therebetween. The direct current voltage source 42 is connected to the dark-current suppressing electrode 41 to normally apply a negative voltage to the dark-current suppressing electrode 41.

In the solid-state image capturing device 51, the potentials in the substrate along the lines A-A', B-B', and C-C' in FIG. 7 have the same profiles as those in FIG. 3 according to the first embodiment.

The second dark-current suppressor 43 in the solid-state image capturing device 51 may be formed by forming the dark-current suppressing electrode 41 in the process shown in FIG. 5F without forming the second dark-current suppressor 23 in the process shown in FIG. 5E in the manufacturing method according to the first embodiment. The other manufacturing processes are the same as those of the first embodiment.

In the solid-state image capturing device 51 according to this embodiment, the surface of the N area 22 of the storage capacitor 20 is reversed and filled with holes by normally applying a negative bias voltage to the dark-current suppressing electrode 41. In this way, since the dark current occurring in the interface of the storage capacitor 20 is normally absorbed in the holes, it is possible to inhibit the dark current in the storage capacitor 20. In this embodiment, the negative bias voltage is applied to the dark-current suppressing electrode 41. However, by electrically connecting the dark-current suppressing electrode 41 to the light shielding film 31, a negative voltage may be applied to the dark-current suppressing electrode 41 and the light shielding film 31.

The solid-state image capturing device 51 according to this embodiment is driven by the same driving method as that of the first embodiment. Accordingly, it is possible to obtain the same advantages as those of the first embodiment. That is, the dark current is inhibited and the S/N ratio is improved.

Figure 8:
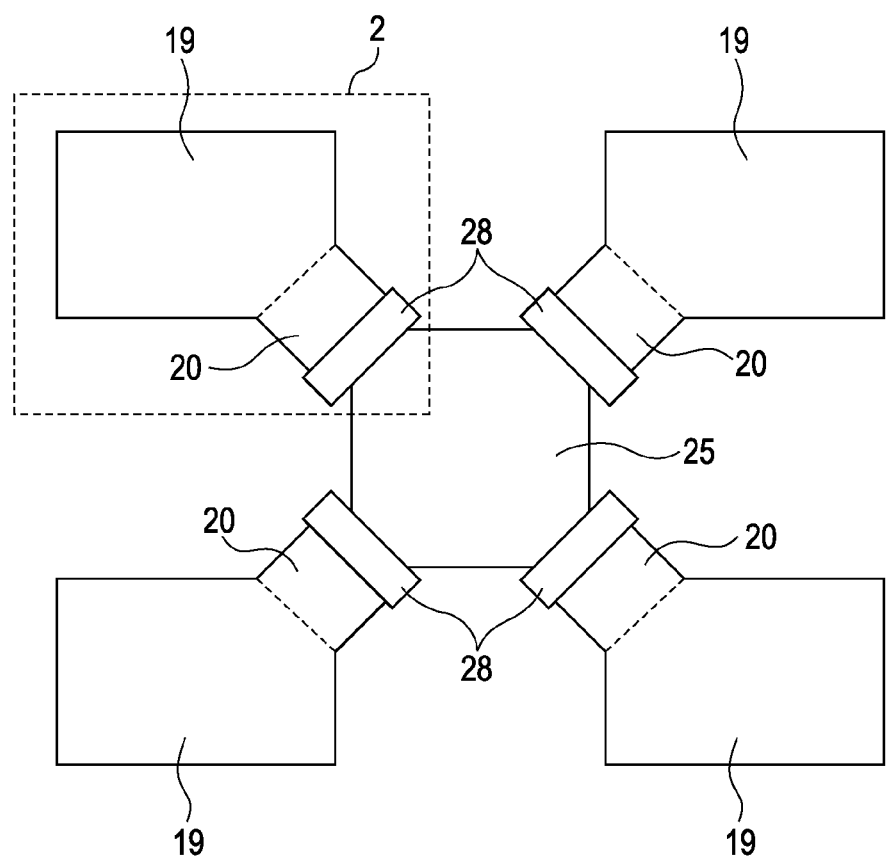
FIG. 8 is a schematic plan view illustrating a solid-state state image capturing device according to a third embodiment of the invention.

3. Third Embodiment: Example (Layout Example) of Solid-State Image Capturing Device FIG. 8 is a schematic plan view illustrating a solid-state image capturing device 52 according to a third embodiment of the invention. The overall configuration of the solid-state image capturing device according to this embodiment is the same as that in FIG. 1 and the cross-section configuration of a pixel is the same as that in FIG. 2 or 7. In this embodiment, an example of the layout of a pixel is shown. In FIG. 8, the same reference numerals are given to the same portions as those in FIGS. 2 and 7 and the repeated description is omitted.

FIG. 8 shows adjacent four pixels 2. Each of the pixels 2 has the same configuration as that of the solid-state image capturing device according to the first or second embodiment.

In the solid-state image capturing device 52 according to this embodiment, the four pixels 2 adjacent vertically and horizontally to each other share one FD portion 25. That is, since four storage capacitors 20 are formed adjacent to one FD portion 25, the storage capacitors 20 are connected to form the light receivers 19. The transmission gate electrode 28 is formed between the FD portion 25 and each of the storage capacitors 20.

In the four pixels 2 sharing the FD portion 25, the light reception period is initiated by setting the substrate voltage Vsub to Low, and the signal charges subjected to the photoelectric conversion simultaneously in the light receivers 19 are transmitted to the storage capacitors 20. By setting the substrate voltage Vsub to High and simultaneously terminating the light reception period, the signal charges from the light receivers 19 are not transmitted. Therefore, the signal charges are not transmitted to the storage capacitor 20, but are swept to the semiconductor substrate 12 as in the first and second embodiments. While the substrate voltage Vsub is set to High, the signal charges accumulated in the respective storage capacitors 20 are read sequentially in the FD portion 25 and are output by applying the transmission pulse φTRG to the transmission gate electrodes 28, like the first embodiment. In this case, even though not shown, the amplification transistor, the reset transistor, and the selection transistor (as necessary) connected to the FD portion 25 are also shared by the four pixels.

In the solid-state image capturing device having the global shutter function of accumulating the signal charges in the FD portion according to the related art, it is necessary to form the FD portion in each unit pixel. For this reason, the FD portion may not be shared by plural pixels. In the solid-state image capturing device 52 according to this embodiment, since the signal charges are accumulated in the storage capacitor 20 and the signal charges accumulated in the storage capacitor 20 are read in the FD portion 25 by turning on/off the transmission gate electrode 28, the FD portion 25 can be shared by the plural pixels. Accordingly, since the area of the storage capacitor 20 in each pixel 2 or the area of the light receiver 19 can be set to be large, it is possible to increase sensitivity or an amount of charge.

In this embodiment, one FD portion 25 is shared by the four pixels 2. However, one FD portion 25 can be shared by two pixels 2 when plural pixels share one FD portion 25.

In the solid-state image capturing device 52 according to this embodiment, it is possible to obtain the same advantages as those of the solid-state image capturing devices 1 and 51 according to the first and second embodiments.

The above-described first to third embodiments have described the CMOS type solid-state image capturing device in which the unit pixels detecting the signal charges generated in accordance with the amount of incident light as a physical quantity are arranged in a matrix shape. However, the invention is not limited to the CMOS image sensor. The invention is not limited to a column type solid-state image capturing device in which a column circuit is disposed in each pixel column of a pixel array.

The invention is not limited to the solid-state image capturing device which captures an image by detecting the distribution of the amount of incident visible light as the image, but may be applied to a solid-state image capturing device capturing the distribution of the amount of incident infrared ray, x ray, or particle as an image. The invention may also be applied to a solid-state image capturing device (physical quantity distribution detecting device), such as a fingerprint detecting sensor, capturing the distribution of another physical quantity as an image by detecting the distribution of another physical quantity, such as inputting or electrostatic capacity in a broad sense.

The invention is not limited to the solid-state image capturing device configured to read pixel signals from unit pixels by sequentially scanning the unit pixels of the pixel array in a column unit. The invention is also applicable to an X-Y address type solid-state image capturing device configured to select arbitrary pixels in a pixel unit and read signals in the pixel unit from the selected pixels.

The solid-state image capturing device may be formed in one chip or may be formed in a module shape in which an image capturing unit and a signal processing unit or an optical system are packed and which has an image capturing function.

In the above-described first to third embodiments, the first conduction type is configured as the N type and the second conduction type is configured as the P type. However, the first conduction type may be configured as the P type and the second conduction type may be configured as the N type. In this case, the desired pulse applied to the solid-state image capturing device is a pulse with a reverse polarity, unlike the above-described example.

The invention is not limited to the solid-state image capturing device, but may be applied to an image capturing device. Here, the image capturing device is a camera system such as a digital camera or a video camera or an electronic apparatus having an image capturing function, such as a cellular phone. The module mounted in an electronic apparatus, that is, a camera module may be used as an image capturing device.

4. Fourth Embodiment: Example of Electronic Apparatus

Figure 9:
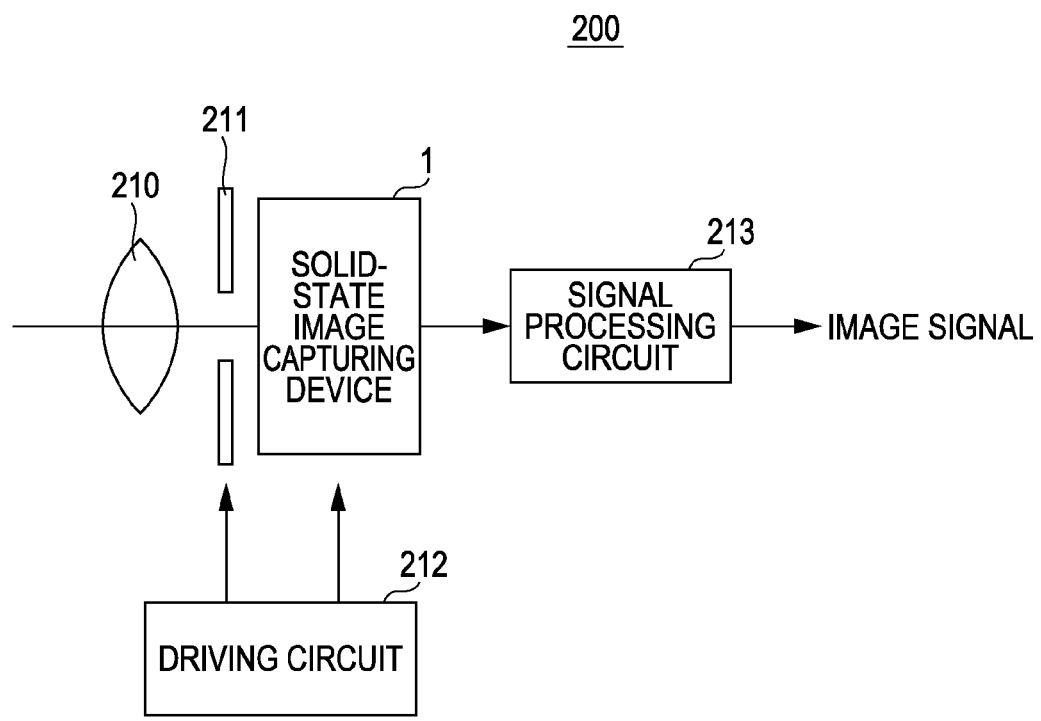
FIG. 9 is a schematic diagram illustrating the configuration of an electronic apparatus according to a fourth embodiment of the invention.

FIG. 9 is a diagram illustrating the overall configuration of an electronic apparatus 200 according to a fourth embodiment of the invention.

In the electronic apparatus 200 according to this embodiment, the solid-state image capturing device 1 according to the first embodiment is used as a camera.

FIG. 9 is the schematic diagram illustrating the configuration of the electronic apparatus 200 according to the fourth embodiment of the invention. The electronic apparatus 200 according to this embodiment is a digital camera capable of capturing a still image.

The electronic apparatus 200 according this embodiment includes the solid-state image capturing device 1, an optical lens 210, a shutter device 211, a driving circuit 212, and a signal processing circuit 213.

The optical lens 210 forms image light (incident light) obtained from an object on an image capturing surface of the solid-state image capturing device 1. Accordingly, the signal charges are accumulated in the solid-state image capturing device 1 during a certain period.

The shutter device 211 controls a light emission period and a light shielding period of the solid-state device 1.

The driving circuit 212 supplies a driving signal used to control a transmission operation of the solid-state image capturing device 1 and a shutter operation of the shutter device 211. The signal is transmitted to the solid-state image capturing device 1 in response to the driving signal (timing signal) supplied from the driving circuit 212. The signal processing circuit 213 executes a variety of signal processing operations. An image signal subjected to the signal processing operations is stored in a storage medium such as a memory or output to a monitor. The shutter device is used particularly when strong incident light is captured or smearing is reduced to a very small level, but is not used in accordance with usages. In this embodiment, the digital camera is used. However, in the image capturing device with the above configuration may be used as a video capturing device having a global shutter function of simultaneously receiving light in a picture surface.

In the electronic apparatus 200 according to this embodiment, the CMOS type solid-state image capturing device 1 having the global shutter function is used. Therefore, it is possible to obtain an image signal of an image captured simultaneously in all the pixels. Accordingly, it is possible to reduce deformation occurring when a moving subject is photographed. In the solid-state image capturing device 1, the dark current is inhibited and the S/N ratio is improved. In the electronic apparatus 200 according to this embodiment, an image quality resulting from the inhibiting of the dark current and the improvement in the S/N ratio is improved.

The electronic apparatus to which the solid-state image capturing device 1 is applied is not limited to the camera. However, the solid-state image capturing device 1 is applicable to a digital camera or an image capturing device such as a camera module for a mobile apparatus such as a cellular phone.

In this embodiment, the solid-state image capturing device 1 is used in the camera, but the solid-state image capturing devices according to the second and third embodiments may be used.

The present application contains subject matter related to that disclosed in Japanese Priority Patent Application JP 2009-025347 filed in the Japan Patent Office on Feb. 5, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image capturing device comprising:
a substrate;
a substrate voltage source which applies a first potential to the substrate during a light reception period and applies a second potential to the substrate during a non-light reception period; and
a plurality of pixels each of which includes
a light receiver which is formed on a front surface of the substrate and generates signal charges in accordance with received light,
a storage capacitor which is formed adjacent to the light receiver and accumulates and stores signal charges generated by the light receiver, the signal charges being transmitted when the first potential is applied to the substrate,
dark-current suppressors which are formed in the light receiver and the storage capacitor,
an electronic shutter adjusting layer which is formed in an area facing the light receiver in the substrate and distant from the storage capacitor by a predetermined offset area and which adjusts potential distribution of the substrate so that the signal charges generated in the light receiver when the second potential is applied to the substrate are swept to a rear surface of the substrate, and
a floating diffusion portion to which the signal charges accumulated in the storage capacitor are transmitted.

2. The solid-state image capturing device according to claim 1, wherein:
(a) the substrate includes:
a first conduction type semiconductor substrate and
a second conduction type semiconductor well layer formed on the semiconductor substrate;
(b) the light receiver has a junction surface of the dark-current suppressor formed of a second conduction type and a first conduction type impurity area and a junction surface of the first conduction type impurity area and a second conduction type impurity area formed in a lower portion of the first conduction type impurity area, and the light receiver is formed in the semiconductor well layer;
(c) the storage capacitor has a junction surface of a first conduction type impurity area and a second conduction type impurity area; and
(d) the electronic shutter adjusting layer is formed between the semiconductor substrate and the semiconductor well layer by a first conduction type impurity area.

3. The solid-state image capturing device according to claim 2, wherein an electrostatic potential of the storage capacitor is deeper than an electrostatic potential of the light receiver.

4. The solid-state image capturing device according to claim 3, wherein an electrostatic potential of an area between the light receiver and the storage capacitor above the offset area is maintained with substantially the same value during the light reception period and the non-light reception period.

5. The solid-state image capturing device according to claim 4, wherein a light shielding film is formed above the storage capacitor on a light incident side, and an end of the light shielding film has a protrusion portion protruding toward the light receiver.

6. The solid-state image capturing device according to claim 5, wherein:
a transmission gate portion is formed between the light receiver and the floating diffusion portion, and
the light shielding film is also formed above the transmission gate portion and the floating diffusion portion on the light incident side.

7. The solid-state image capturing device according to claim 6, wherein the dark-current suppressors of the light receiver and the storage capacitor are formed by second conduction impurity areas formed on surfaces of the light receiver and the storage capacitor on the light incident side.

8. The solid-state image capturing device according to claim 6, wherein:
the dark-current suppressor of the light receiver is formed by a second conduction type impurity area formed on a surface of the light receiver on the light incident side, and
the dark-current suppressor of the storage capacitor is formed by a dark-current suppressing electrode formed above the storage capacitor on the light incident side and a direct current voltage source applying a direct current voltage to the dark-current suppressing electrode.

9. The solid-state image capturing device according to claim 6, wherein the dark-current suppressing electrode is electrically connected to the light shielding film.

10. The solid-state image capturing device according to claim 1, wherein the floating diffusion portion is shared with a plurality of the adjacent storage capacitors, and the signal charges are sequentially transmitted from the plurality of adjacent storage capacitors to the floating diffusion portion.

11. The solid-state image capturing device according to claim 1, further comprising:
a reset transistor which resets the signal charges accumulated in the floating diffusion portion; and
an amplification transistor which amplifies the signal charges transmitted to the floating diffusion portion.

12. A method of manufacturing a solid-state image capturing device, comprising the steps of:
preparing a first conduction type semiconductor substrate;
forming a second conduction type semiconductor well layer on the semiconductor substrate;
forming a light receiver, a storage capacitor adjacent to the light receiver, and a floating diffusion portion adjacent to the storage capacitor with a transmission gate portion interposed therebetween on a surface of the semiconductor well layer;
forming a first conduction type electronic shutter adjusting layer in an area facing the light receiver between the semiconductor substrate and the semiconductor well layer and distant from the storage capacitor by a predetermined offset distance before or after forming the semiconductor well layer; and
forming dark-current suppressors above the storage capacitor and the light receiver on a light incident side.

13. The method according to claim 12, wherein the semiconductor well layer is formed by a second conduction type epitaxial growth layer formed on the semiconductor substrate.

14. The method according to claim 12, wherein the semiconductor well layer is formed by forming a first conduction type epitaxial growth layer on the semiconductor substrate and then ion-implanting second conduction type impurities in a desired area of the epitaxial growth layer.

15. An electronic apparatus comprising:

an optical lens;

a solid-state image capturing device including (a) a substrate, (b) a substrate voltage source which applies a first potential to the substrate during a light reception period and applies a second potential to the substrate during a non-light reception period, and (c) a plurality of pixels each of which includes (1) a light receiver which is formed on a front surface of the substrate and generates signal charges in accordance with received light, (2) a storage capacitor which is formed adjacent to the light receiver and accumulates and stores signal charges generated by the light receiver, (3) the signal charges being transmitted when the first potential is applied to the substrate, (4) dark-current suppressors which are formed in the light receiver and the storage capacitor, (5) an electronic shutter adjusting layer which is formed in an area facing the light receiver in the substrate and distant from the storage capacitor by a predetermined offset area and which adjusts potential distribution of the substrate so that the signal charges generated in the light receiver when the second potential is applied to the substrate are swept to a rear surface of the substrate, and (6) a floating diffusion portion to which the signal charges accumulated in the storage capacitor are transmitted; and a signal processing circuit which processes an output signal output from the solid-state image capturing device.

* * * * *